United States Patent
Cockburn et al.

(10) Patent No.: US 7,030,787 B2
(45) Date of Patent: Apr. 18, 2006

(54) CIRCUIT AND METHOD FOR USE IN DATA COMPRESSION

(75) Inventors: Gordon J. Cockburn, Southampton (GB); Adrian John Hawes, Eastleigh (GB)

(73) Assignee: International Business Machines Corporation, Armonk, NY (US)

( * ) Notice: Subject to any disclaimer, the term of this patent is extended or adjusted under 35 U.S.C. 154(b) by 4 days.

(21) Appl. No.: 10/513,379

(22) PCT Filed: Jan. 30, 2003

(86) PCT No.: PCT/GB03/00388

§ 371 (c)(1),
(2), (4) Date: Nov. 3, 2004

(87) PCT Pub. No.: WO03/096544

PCT Pub. Date: Nov. 20, 2003

(65) Prior Publication Data

US 2005/0162287 A1    Jul. 28, 2005

(30) Foreign Application Priority Data

May 9, 2002    (GB) .................................... 0210602

(51) Int. Cl.
  *H03M 7/00*    (2006.01)
(52) U.S. Cl. .......................................... 341/51; 341/50
(58) Field of Classification Search .................. 341/51, 341/50; 382/234; 711/108; 327/107
See application file for complete search history.

(56) References Cited

U.S. PATENT DOCUMENTS

| 4,325,085 | A | * | 4/1982 | Gooch | 382/234 |
| 5,440,753 | A | * | 8/1995 | Hou et al. | 711/108 |
| 6,060,917 | A | * | 5/2000 | Saul | 327/107 |
| 6,611,264 | B1 | * | 8/2003 | Regan | 345/422 |

FOREIGN PATENT DOCUMENTS

| EP | 0 279 227 | * | 8/1988 |
| EP | 0279227 | * | 8/1988 |

OTHER PUBLICATIONS

Jung et al., "Efficient VLSI For Lempel-Ziv Compression in WIreless Data Communication Networks", IEEE transactions on very scale integration system, vol. 6, No. 3, Sep. 1998.*

* cited by examiner

*Primary Examiner*—Jean Bruner Jeanglaude
(74) *Attorney, Agent, or Firm*—Dale M. Crockatt; Dillon & Yudell LLP (57) ABSTRACT

An apparatus for performing data compression is disclosed. A circuit (640) within a comparison unit (400) of a comparison matrix (170) performs LZ1 compression of a data string by comparing bytes held in an input buffer (140) with bytes held in a history buffer (110, 120). A group of logic gate stages (720, 730, 740, 750) is connected in series with each other. Each of the logic gate stages produces a carry value that is passed to one of the output of the comparison unit and another logic gate stages. The product of the number stages in the logic gate stages and the number logic gates in each of the logic gate stages is less than the number of logic gates required for an equivalent circuit having a single logic circuit stage.

8 Claims, 10 Drawing Sheets

CIRCUIT AND METHOD FOR USE IN DATA COMPRESSION

PRIORITY CLAIM

The present application claims priority to PCT Application No. PCT/GB03/00388 filed on Jan. 30, 2003.

BACKGROUND OF THE INVENTION

1. Technical Field

The present invention relates to data compression in general, and, in particular, to an apparatus for performing data compression. Still more particularly, the present invention relates to an apparatus for performing data compression according to Lempel-Ziv algorithms.

2. Description of Related Art

Lempel-Ziv algorithms are well-known in the field of data compression. In particular, the "history buffer" version, commonly known as an LZ1 algorithm, has become particularly popular in hardware implementations wherever lossless compression of coded data is required. This is because an LZ1 algorithm has a relatively modest buffer requirement and predictable performance, which make it a good fit for most technologies.

Generally speaking, an LZ1 algorithm works by examining a string of characters and keeping a record of the characters. Then, when an input string appears that has occurred before in the recent history, the input string is replaced in the output string by a token—a code indicating where in the past the input string has occurred and for how long. Both a compressor and decompressor must use a "history buffer" of a defined length, but otherwise no more information are needed to be passed between the compressor and decompressor.

Characters that have not been seen before in a worthwhile string are coded as a literal. This amounts to an expansion of the number of bits required, but in most types of data. Since the opportunities for token substitution (and hence compression) outweigh incompressible data, so an overall compression can be achieved. The compression ratios for LZ1 algorithms typically range from 2:1 to approximately 10:1.

Some variations of the basic LZ1 algorithm have emerged over the years, but improvements have been incremental.

As an LZ1 algorithm works on units of a byte, traditional hardware implementations consider only one byte at a time when compressing an input data stream. As each byte is being input, the history buffer is scanned by using, for example, a content-addressable memory (CAM), for all occurrences of the byte. As a single byte is not considered an efficient candidate for string replacement, any match found must be supplemented by consecutive matches before a token substitution should take place.

Each subsequent input byte is also sought in the history buffer, but the only matches reported are those following existing matches. Finally, the string match may terminate (when no more match is found to be adjoined to known matches) and the surviving "string match" is coded for token substitution. Needless to say, the longer the match, the greater the saving in bits.

A simple implementation of an LZ1 algorithm that processes one byte per clock cycle is limited to some 100–200 Mbytes/second at typical clock rates for current application specific integrated circuit (ASIC) technology. However, such may not be fast enough for applications such as memory compression, optical networks and RAID disk arrays, which require high bandwidth for a single data stream. To increase performance, i.e., the number of bytes that may be compressed per second, either the cycle time (the time taken to input a byte and find all matches) must be reduced or the CAM be modified to search for more than one byte at a time. Because of the difficulties in designing multiple-input CAMs, performance improvements have usually been focused on reducing the access time (in other words, cycle time) of a CAM. But of course, the two improvements are not mutually exclusive; a multiple-input CAM can gain performance over and above any reduction in cycle time.

The present disclosure provides an improved apparatus for performing data compression.

SUMMARY OF THE INVENTION

In accordance with a preferred embodiment of the present invention, a compression arrangement for performing data compression of a data string includes an input buffer, a history buffer, a comparison matrix, a MAX function/priority encoder and a token encoder. The input buffer holds a first sequence of bytes of the data string. The history buffer holds a second sequence of bytes of the data string.

The comparison matrix is coupled to the input buffer and the history buffer. Each column of the comparison matrix is formed by a group of "triangle" logic gate stages connected in series. Each of the "triangle" logic gate stages is arranged to produce a carry value for passing to another one of the "triangle" logic gate stages. The product of the number stages in the "triangle" logic gate stages and the number logic gates in each of the "triangle" logic gate stages is less than the number of logic gates required for an equivalent circuit having a single logic circuit stage.

The MAX function/priority encoder detects a row of the comparison units and preceding comparison units in the same column in which a largest number of consecutive byte matches occurred. The token encoder encodes as a token a sequence of matched bytes detected by the MAX function/priority encoder.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
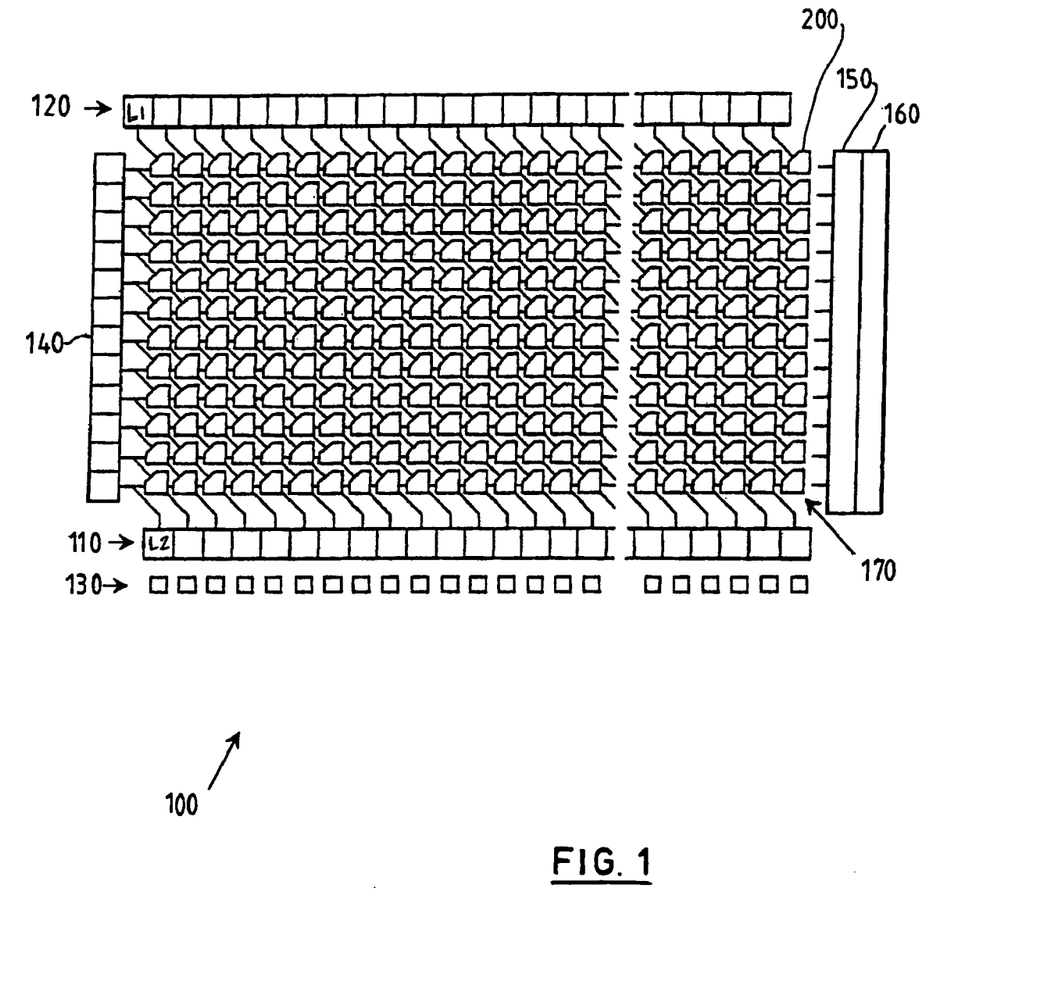
FIG. 1 is a block diagram of a compression arrangement in which a preferred embodiment of the present invention is incorporated.

Referring now to the drawings and in particular to FIG. 1, there is depicted a block diagram of a compression arrangement in which a preferred embodiment of the present embodiment is incorporated. As shown, a compression arrangement 100 includes two groups of 512-byte L1 latches 110 and L2 latches 120, a group of 512 carry latches 130, a 12-byte input buffer 140, a MAX function/priority encoder (MF/PE) 150, a token encoder (TE) 160, and a 512-by-12 matrix array 170 of comparison units 200 (which will be described in greater detail below).

L2 latches 120 are respectively coupled to comparison units 200 in the first row of matrix array 170, and to comparison units diagonally displaced successively by one unit to the right in each lower row of matrix array 170, as will be explained in more detail below. L1 latches 110 and associated carry latches 130 are coupled respectively to comparison units 200 in the last row of matrix array 170. The 12 bytes of input buffer 140 are coupled respectively to the 12 rows of comparison units 200 in the leftmost column of matrix array 170. MF/PE 150 and TE 160 are coupled to the 12 rows of comparison units 200 in matrix array 170.

In the search for matches, the 12 input bytes have to be compared with the entire history buffer (i.e., L1 latches 110 and L2 latches 120). However, some of the input bytes themselves constitute part of the "history." 12-byte input buffer 140 must assume that each byte is in chronological order, even though they all enter in one cycle. Therefore, one end of input buffer 140 is considered "most recent," and the other "least recent," as if the "least recent" bytes entered the process first. Each byte must consider those in input buffer 140 that are "less recent" to be part of the history, and be compared accordingly.

The manner in which the input bytes are compared, both with the bytes in the history buffer and the less recent bytes in input buffer 140, is shown in FIG. 1. Considering input buffer 140 on the left of FIG. 1, if the processing were the conventional type—one byte at a time—then the top byte would be the first in and the bottom byte the last; however, in the present implementation, the bytes are all input at the same time. As can be seen, the outputs of input buffer 140—all 12 input bytes—are connected to the inputs of all comparison units 200 in each row of matrix array 170. In each clock cycle, the contents of the history buffer—all 512 bytes of it—are fed down for comparison with the first (least recent) byte of input buffer 140, and then diagonally down and across for comparison with the most recent byte of input buffer 140.

It will be understood that, as every byte of the history buffer must be available at once, conventional random access memory (RAM) cannot be used as the history buffer. In the present implementation, the history buffer is constructed using registers, arranged as level sensitive scan design (LSSD) L1–L2 pairs. At the end of each clock cycle, the 12 input bytes are shifted into the history buffer, the old contents of the history buffer are shifted along (to the right as shown in FIG. 1) by 12 bytes, and the oldest 12 bytes are discarded.

Figure 2:
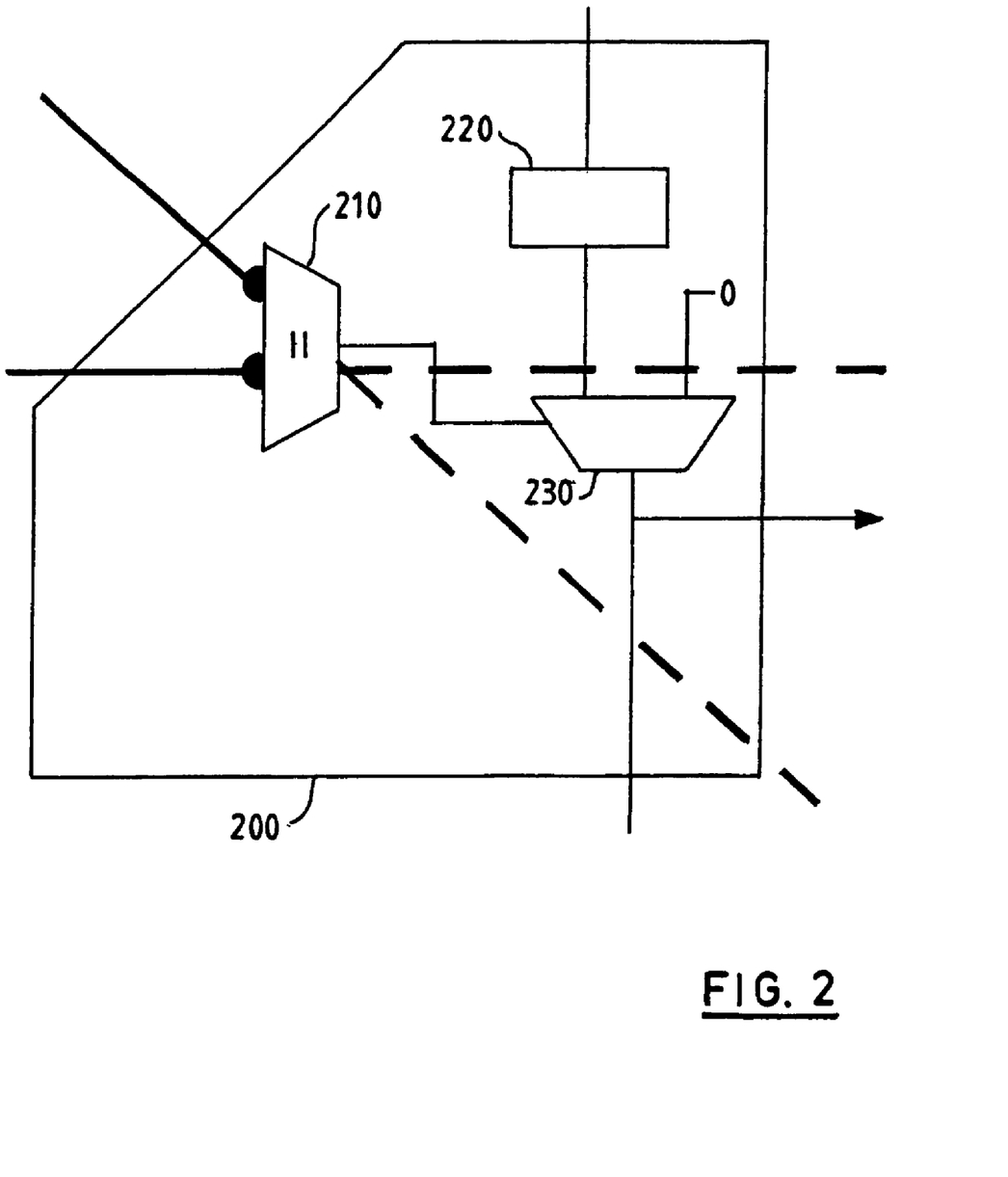
FIG. 2 is a schematic diagram of a comparison unit within the compression arrangement of FIG. 1.

Comparison units 200, represented by clipped squares in FIG. 1, are a fundamental element of the present design. An expanded diagram of one of comparison units 200 is shown in FIG. 2. It is the responsibility of each comparison unit to compare the values of the two input bytes, tally up the count of matched bytes, and report a winning match to control logic.

As shown in FIG. 2, comparison unit 200 in matrix array 170 includes a byte comparator 210 arranged to receive for comparison a byte value from the input buffer byte position for that row and a history buffer byte value passed from a unit diagonally left and above. An incrementer 220 is arranged to receive and increment by "1" a "count in" value from a unit directly above in the same column of matrix array 170. A selector 230 is arranged to receive the incremented count value and a "0" value and to select between these in dependence on the output of comparator 210. If comparator 210 indicates a match, selector 230 outputs the incremented count value; otherwise, selector 230 outputs a "0" value. The output of selector 230 is passed as a "count out" value to a unit directly below in the same column; the output of selector 230 is also passed to MF/PE 150 for the same row of matrix array 170. As shown by the dashed lines, the byte values input to selector 210 are passed to a unit directly to the right in the same row and to a comparison unit diagonally below and right.

In addition to the byte to be compared, comparison unit 200 takes as input the "count" from the comparison unit above, which indicates the length of the string seen thus far, and the byte for the same row of input buffer 140. If the two input bytes match, then comparison unit 200 will increment that count, and pass the new count to the comparison unit below. If the two bytes do not match, then the output count will be set to zero, regardless of the input count value.

The value of this count is also output from the right-hand side of each comparison unit, and is fed to MF/PE 150 at the end of the row. There is one of these MF/PE units for each of the twelve rows of compressor 100. The function of MF/PE 150 is to decide which comparison unit(s) 200 of the 512 in that row reported the longest string (i.e., the largest count—the MAX function), and to encode the position within the row. If more than one column produces the same large count, then MF/PE 150 encodes (arbitrarily) the leftmost value (the priority encoding function). However, it may be noted that the value produced by MF/PE 150 is not necessarily the string that will be encoded, as the string may continue beyond that row.

String matches that are still alive in row 12 (the last row of matrix array 170) may continue into the next cycle. Carry latches 130 at the bottom of FIG. 1 store the position of any surviving strings from this row (the length of that string—the "count"—is stored in a separate single register, not shown). The carry is fed into the "count input" to the first row of comparison units in the next cycle. It may be noted that there is a limit to the string length that can be encoded by an LZ1 algorithm, imposed by the number of bits in the token. When the maximum number has been reached, a token is emitted and the string must start from zero. It will be appreciated that TE 160 operates in the same manner known in the prior art and its structure and function need not be described in any further detail.

The largest string values for each row (reported by MF/PE 150) and their encoded positions are fed to TE 160. TE 160 examines the reported lengths for each row, and decides where strings can be encoded for this batch of 12 input bytes. Where strings are to be encoded, TE 160 uses the positions reported by MF/PE 150 as part of the token, along with the string length. Note that the length may rise to more than 12, when a long string spans more than one cycle. When this happens, the count is accumulated in TE 160, ready for coding when the string terminates.

If no strings are found (noting that a match of just one byte is not worth encoding) or if some of the 12 bytes cannot be matched, then TE 160 must output literals. For this, TE 160 takes data directly from input buffer 140.

Figure 3:
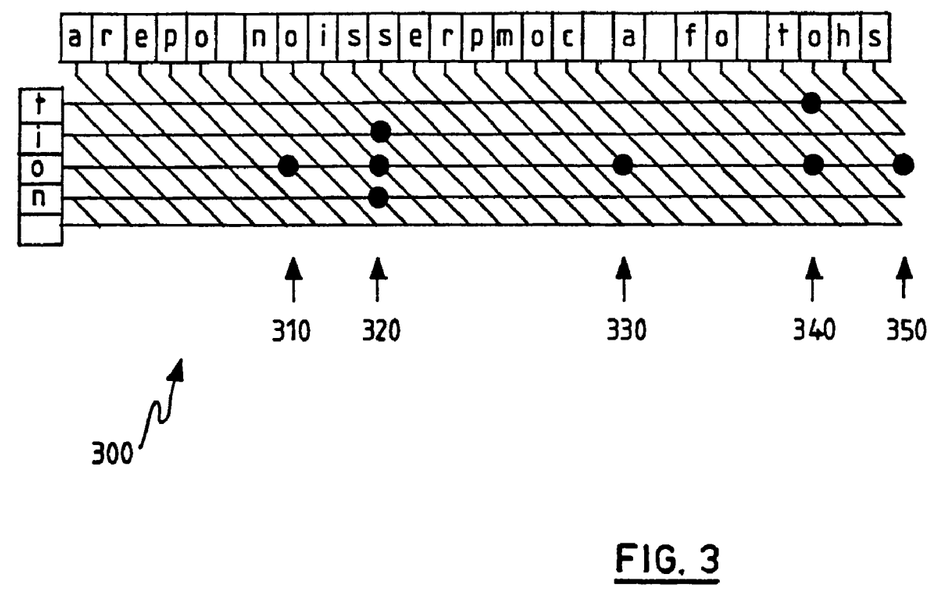
FIG. 3 is a graphical illustration of a compression operation within the compression arrangement of FIG. 1.

FIG. 3 shows a snapshot of a compression operation 300. The previous sentence is used as input, and for simplicity, only 5 input bytes and 27 history buffer bytes are shown. The filled circles (at columns 310, 320, 330, 340 and 350) indicate where a match is detected; a useful string match can be seen at column 320 in the current input bytes "ion." It is the position of column 320 in the row that will be forwarded for encoding.

Figure 4:
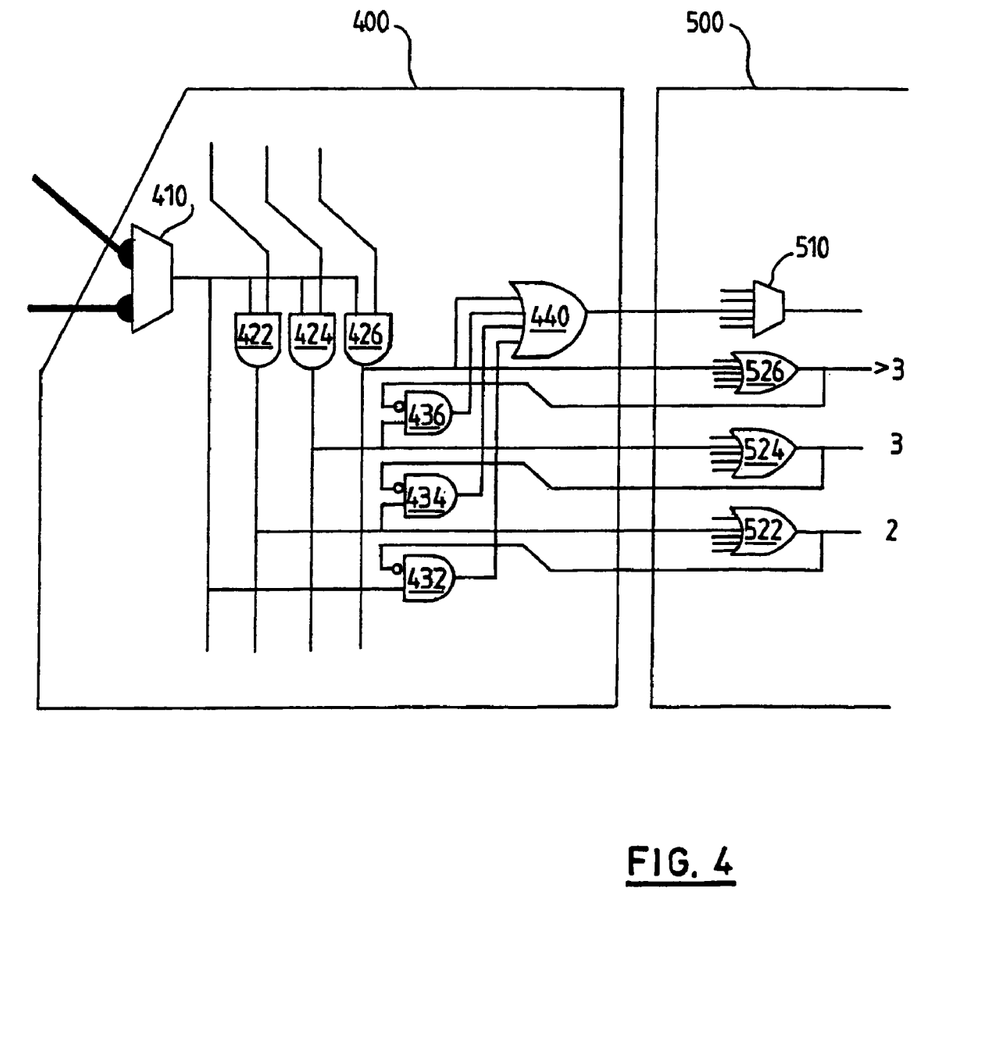
FIG. 4 is a schematic diagram of a comparison unit matrix within the compression arrangement of FIG. 1.

An exemplary implementation of a comparison unit is shown in FIG. 4. As shown, a comparison unit 400 (which is a unit of row 3 of matrix array 170) has a comparator 410 that receives the two byte values to be compared as described above. Three AND gates 422, 424 and 426 each have one of their inputs connected to receive the output of the comparator 410, and have their other inputs connected to receive respective ones of three bit lines (carrying a 3-bit "input count" value) from a comparison unit directly above in the same column. The outputs of AND gates 422, 424 and 426, together with the output of the comparator 410, (carrying a 4-bit 'output count' value) are connected to a comparison unit directly below in the same column. The leftmost three of the 'output count' bit lines are connected respectively to inputs of three AND gates 432, 434 and 436. The outputs of the AND gates 432, 434 and 436, together with the output of the AND gate 426, are connected to inputs of a 4-input OR gate 440.

The output of OR gate 440 (together with outputs of the other comparison units 400 in row 3 of matrix array 170) are connected, within an MF/PE 500, to inputs of a 512-input priority encoder 510. Also within MF/PE 500, the outputs of the AND gates 422, 424 and 426 are connected (together with outputs of AND gates of other comparison units 400 in row 3 of the matrix 170) to respective inputs of 512-input OR gates 522, 524 and 526. The outputs of OR gates 522, 524 and 526 are connected invertedly to inputs of AND gates 432, 434 and 436 in each of comparison units 400 in row 3 of matrix array 170.

Comparator 410 is the same as comparator 210 in comparison unit 200 in FIG. 2, but in comparison unit 400, the "count" is maintained by an N-bit vector. The bits of the N-bit vector are numbered 1 to N, and a count of "n" is represented by bits 1 to n being "1." All other bits in the vector are "0." Thus, a count of zero is shown by all bits being zero. This is a useful method of counting in the present design because:

1. the number of bits required, N, need only be as large as the row number (row 1 needs only 1 bit, row 12 needs 12 bits);
2. the "count" can be easily incremented by merely shifting to the right with a "1" fill; and
3. a MAX function can be easily implemented by ORing the respective bits of all the vectors together.

With a small amount of extra logic (in the form of AND gates 432, 434 and 436 and OR gate 440) in comparison unit 400, priority encoder 510 is made simple also.

The operations of comparison unit 400 are as follows. The input count is represented by a 3-bit vector, which can indicate four values:

| Vector Indicated Value | Indicated Match |
|---|---|
| 000 | zero |
| 100 | one match in this column in row 2 |
| 110 | two matches in this column in rows 1 and 2 |
| 111 | more than two matches in this column in rows 1 and 2, and a carry |

If comparator 410 detects a match in this column in row 3, comparator 410 will increment the count, producing a 4-bit vector "output count" from the bottom of comparison unit 400. The incrementation will be achieved by effectively shifting the input vector right by one bit, adding a "1" at the left. If there is no match here, AND gates 422, 424 and 426 are all turned off and the "output count" collapses to zero.

A modified version of the 4-bit count is output to logic circuitry 510, 522, 524 and 526 in MF/PE 500 at the end of the row, also shown in FIG. 4. Three 512-input OR gates 522, 524 and 526 decide the maximum count for this row (the low-order bit is not used as it represents a count of only 1 byte). This maximum value is used to disqualify all counts smaller than the winning count, by means of AND gates 432, 434 and 436 in comparison units 400 of the columns that do not contribute the maximum count. Those comparison units that show the maximum counts declare their candidacy on the encoder input, and priority encoder 510 codes the position of the leftmost of them. The "win" outputs of OR gates 440 in the comparison units of the bottom row comprise the 512 "carry" bits to be stored for the next cycle.

Although the above description has shown all operations happening in a single cycle, the design does not preclude some elements of pipelining. The critical factor is that the carry for each row must be successfully stored in one cycle, ready for inclusion in the next cycle's calculations.

The critical timing path-producing a valid carry for the next cycle—consists of up to 12 AND gates (from a string of 12 matches), through a 512-input OR gate (which probably has several cascaded gates) and then through two more AND gates for the carry.

Thus, a total of about 20 gate delays determines the maximum operating frequency for this design. The 12 AND gate delays may be reduced by using look-ahead techniques, although this adds to the gate count.

It can be understood that comparison units 400 in the lower rows of matrix array 170 have proportionally more gates, and so it can be understood that the total number of gates increases with the square of the number of bytes processed per cycle.

Reducing Gate Count

Since the total number of gates increases with the square of the number (N) of bytes processed per cycle (according to the formula N(N+1)/2), the total number of gates may become impractical for larger numbers of bytes (e.g., greater than 4) processed per cycle. In order to reduce this impracticality, a further technique may be used to reduce the total number of gates.

Figure 5A:
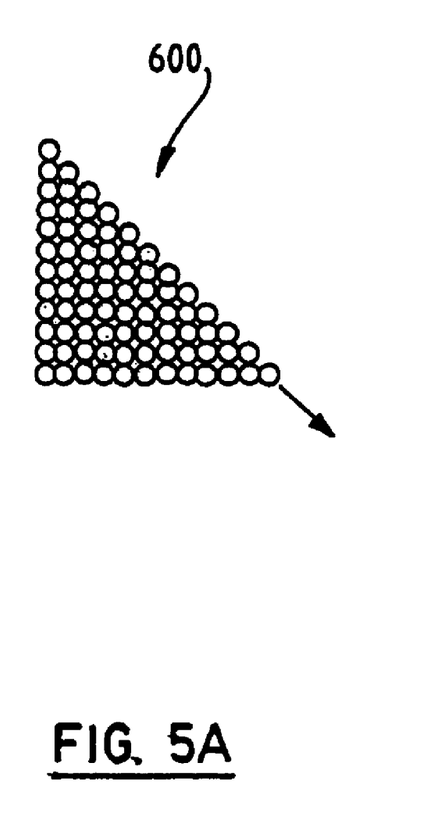
FIGS. 5a–5b are graphical illustrations of a reduction in gate counts that can be achieved by the present invention.

Referring now to FIG. 5A, each column of comparison matrix 170 (from FIG. 1) may be considered as a "triangle" 600 of gates, with the smaller number at the top of the triangle. The output at the bottom of triangle 600 is the "carry" that indicates the longest surviving string(s), and which is stored for the next cycle. The area of the triangle is proportional to the number of gates used.

Figure 5B:
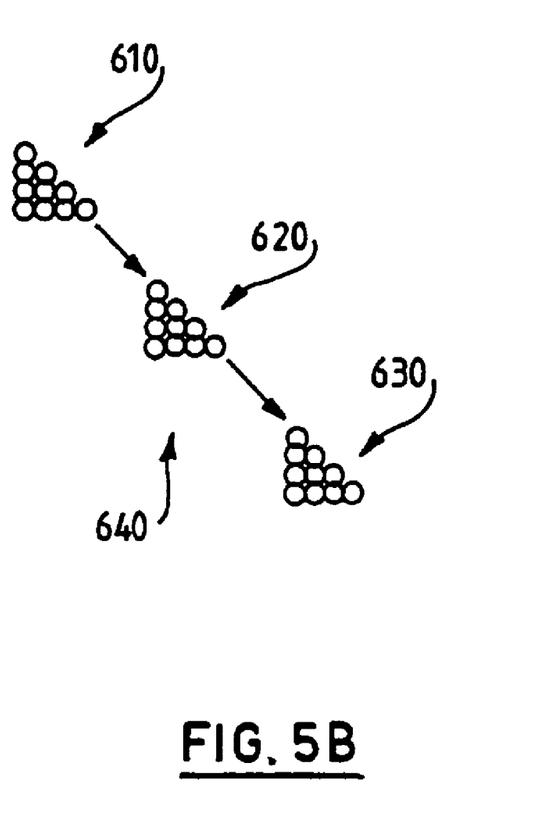

Referring now to FIG. 5B, greater efficiency may be achieved by breaking each triangle into smaller triangles 610, 620, 630, with a correspondingly smaller total area in an arrangement 640. Breaking triangle 600 of FIG. 5A into three triangles 610, 620 and 630 of FIG. 5B results in a reduction from 78 to 30 gates.

Each smaller triangle must produce its own "carry" that serves as an input to the next triangle below. This carry is true on all the columns that signal the longest current string, and so requires feedback from the MF/PE logic. Each carry generation therefore incurs extra delay, and the sum total of all these delays limits the number of triangles that the design can be broken down into, and hence the savings that can be made.

Figure 6A:
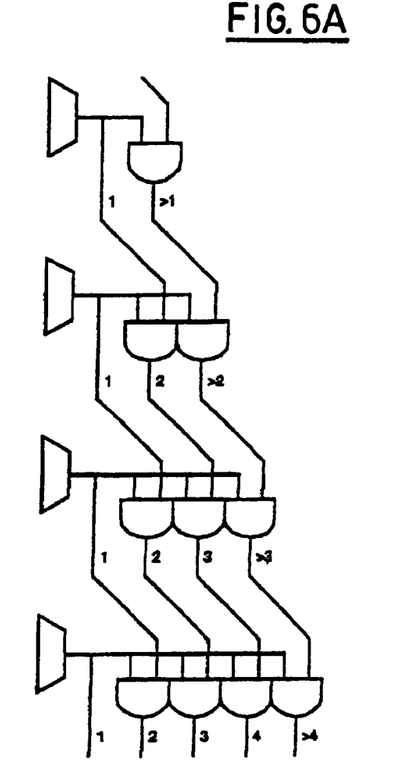
FIGS. 6a–6b are graphical illustrations of an example of a four-way breakdown that can be used in the present invention.
Figure 6B:
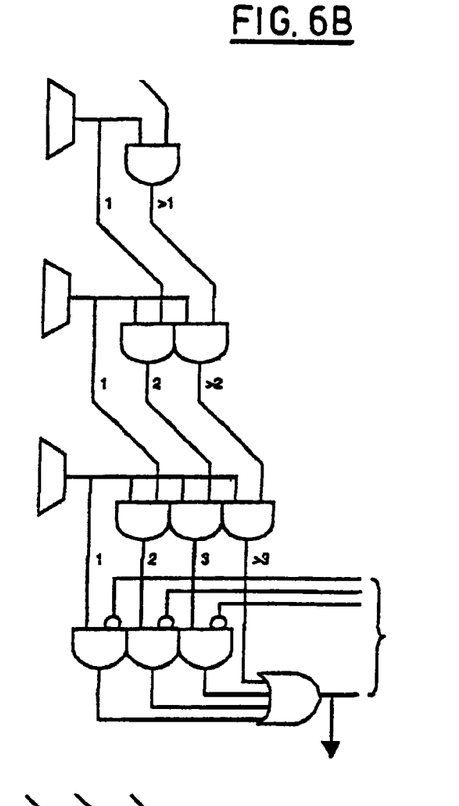

A more detailed example is shown in FIG. 6. The original design (corresponding to the triangular gate arrangement shown in FIG. 5A), which is shown on the left and bottom of the diagram as FIG. 6A, is a 12-byte-per-cycle one, using 12*(12+1)/2 or 78 gates for the string accumulation logic. The time through to the carry out is approximately (12+3) =13 gate delays. The reduced design (of which one quarter is shown in the dashed-line box at the top right of the diagram as FIG. 6B) breaks this into 4 iterations (as compared with the arrangement of FIG. 5B that has 3 iterations) of a 3-byte-per-cycle comparator, costing 4*3*(3+1)/2 or 24 gates, with a through time of 4*(3+3)=24 gate delays.

Reducing Delay

Although in the arrangement of FIG. 6B, the gate count has been reduced significantly, the consequent increased delay may be too great for the required cycle time. To counteract this, some pipelining may be employed.

Figure 7A:
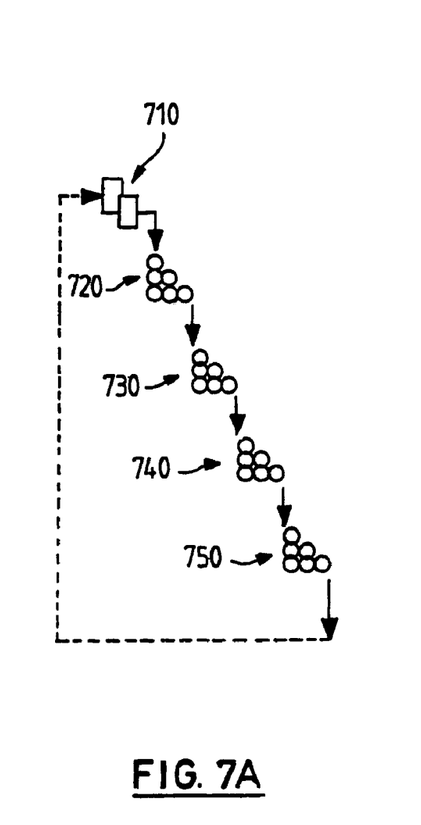
FIGS. 7a–7b are graphical illustrations of a delay reduction that can be used in the present invention.
Figure 7B:
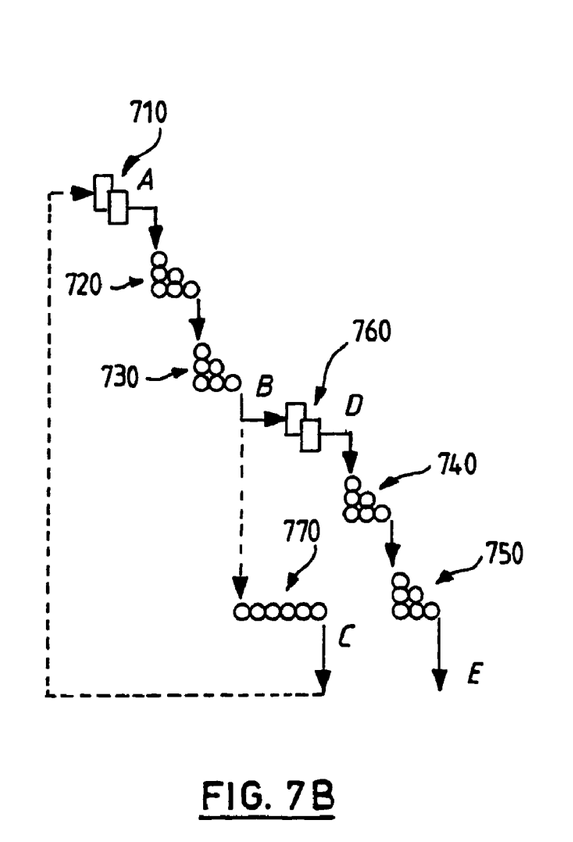

FIG. 7A shows an abbreviated form of FIG. 6B with a latch 710 and four stages or triangles of gates 720, 730, 740 and 750. FIG. 7B shows how the design of FIG. 6B may be further enhanced to reduce delay per cycle. In the arrangement of FIG. 7B, the carry chain of FIG. 7A has been split in two, and the result of the first half carry B from stage 730 is latched (in an intermediate latch 760), ready for the second cycle D. On the second cycle, the latched carry is propagated down the remainder of the chain, while the first half processes the carry for the next cycle. Thus, the required cycle time has been cut in half.

There is a complication, however, in that the first half of the carry chain requires as input A the complete carry for the previous cycle. It requires the same value as would be produced from the arrangement of FIG. 7A. But the previous cycle only produced the carry from the first half of the chain, as the cycle is too short to produce the whole carry.

To solve this, the first half of the carry chain must produce a carry look-ahead C that generates the carry for the full chain. Note that it is not necessary to do the full processing of the column data (that will be accomplished in the second cycle by the logic to the right of intermediate latch 760). It is merely necessary to provide the carry (the column or columns that have the largest surviving string). The carry may be generated in fewer gates than the full processing provided by the second set of gates. The carry look-ahead C is produced at a stage 770.

Carry Look-Ahead

Figure 8:
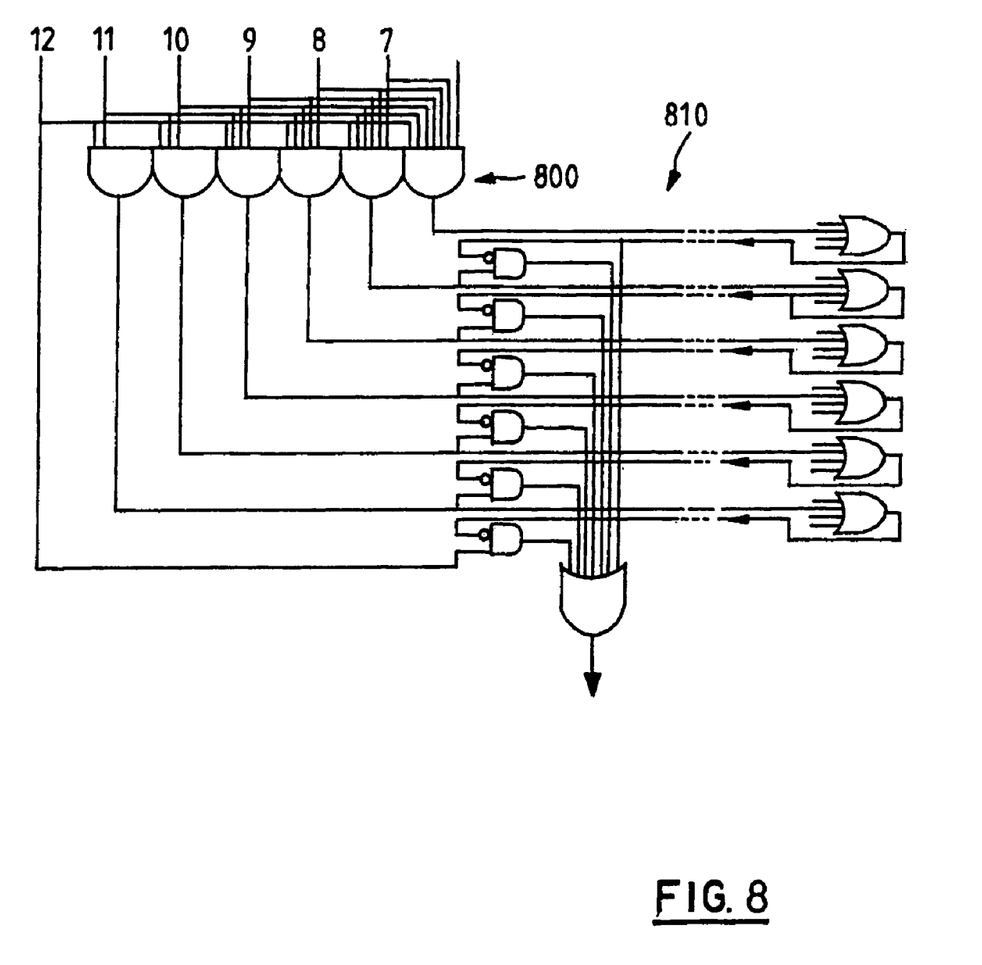
FIG. 8 is a schematic diagram of a circuit for generating a look-ahead carry that can be used in the present invention.

FIG. 8 shows how a look-ahead carry can be generated. The outputs of the six lower comparators (three each from stages 740 and 750) are used along with the carry output from the upper block (signal B in FIG. 7B). Logic 810, which is similar to the carry generator at the bottom of FIG. 6A, determines the best surviving string in the twelfth row. This is a suitable carry for use in the next cycle.

Carry Look-Ahead Pessimism

However, while the carry generated by the look-ahead logic of FIG. 8 is a valid one, it may not give the optimum compression. Because it concentrates on row 12 (which it needs to in order to meet timing constraints), it may miss some other string candidates.

Figure 9:
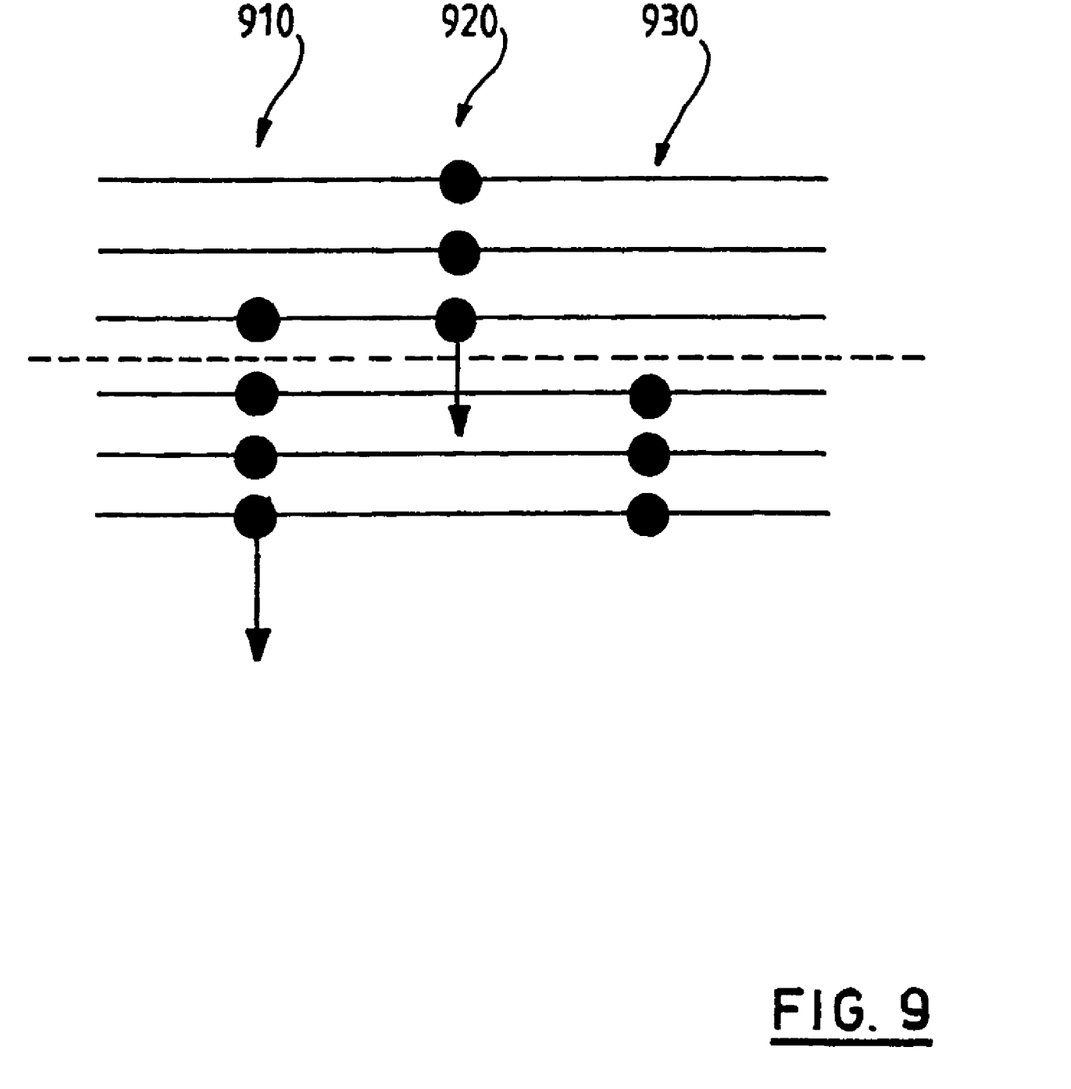
FIG. 9 is a graphical illustration of a carry look-ahead pessimism problem that may arise in the present invention.

FIG. 9 shows an example of how the above-mentioned scenario can happen. As shown, three strings 910, 920 and 930 are occurred in the bottom six rows. The leftmost string 910 of length four has won the look-ahead contest, as it is longer than the rightmost string 930 of length three. But the middle string 920 of length three (not seen by the look-ahead) would have generated the carry from the upper block of three, and eclipsed the leftmost string 910 at this point. With no carry from the upper block, the leftmost string 910 would have begun on the next line, and its length would be reduced to three. Thus, both strings 910 and 930 surviving on the last line would have generated a carry; the rightmost 930 could easily provide a longer match eventually.

The consequence of this "pessimism" (in assuming that the rightmost string 930 would not be the eventual winner) is that fewer carries are stored, which in turn means that strings that could have gone on to efficient lengths in the next cycle are not spotted. This will not produce an error, but may slightly reduce the compression efficiency of the encoder.

Compression efficiency may be restored, however, by sacrificing some of the performance. The lookahead carry generator will always produce the same number as or fewer carries than the full decode. The result of the full decode is known on the second cycle: normally too late for the full speed operation. By comparing the latched values of the look-ahead carry with the full carry output from the second cycle, it may be determined whether the first cycle carry was inefficient. If it was, the cycle may be repeated, with the new carry settings.

Figure 10:
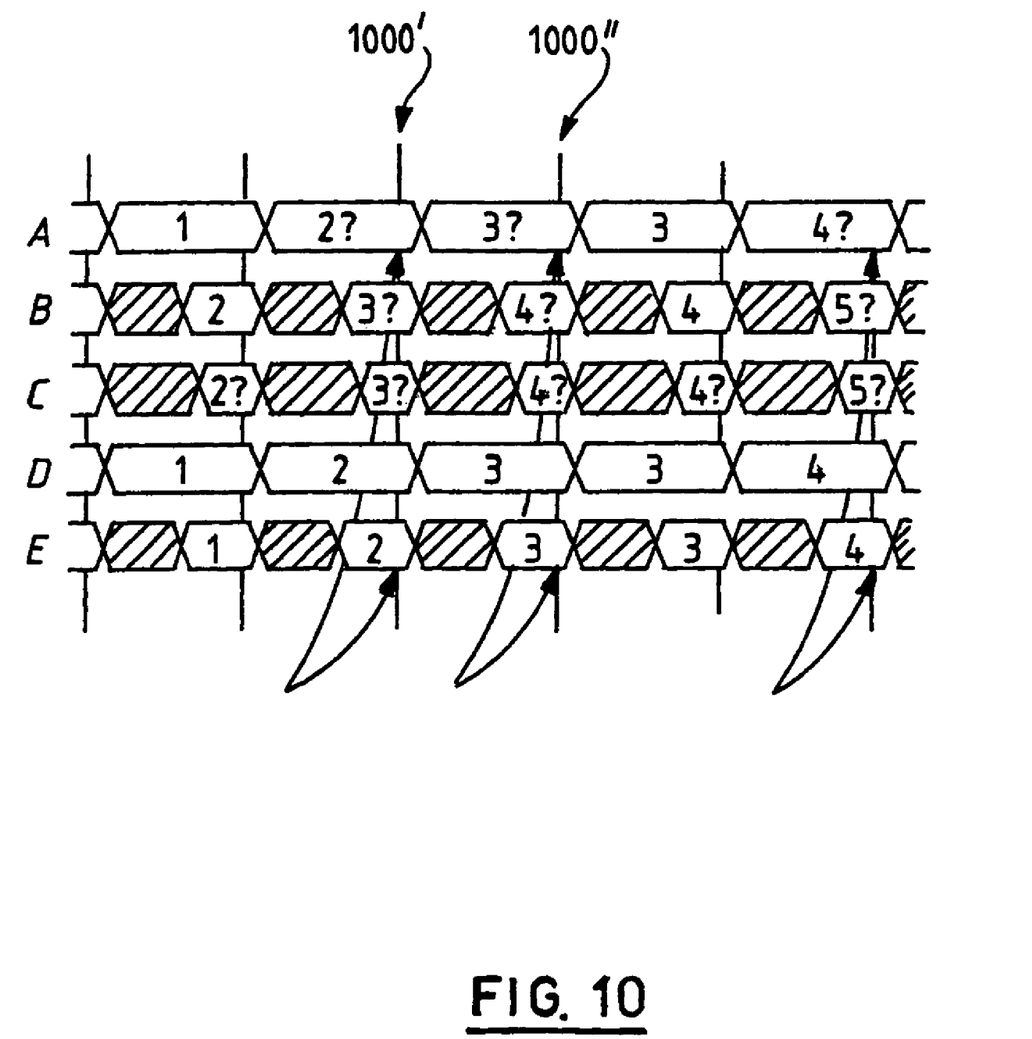
FIG. 10 is a signal timing diagram illustrating a restoration of compression efficiency that can be achieved by the present invention.

FIG. 10 shows an example of how this would operate. The diagram shows the signals at the five points A, B, C, D and E from FIG. 7B, which are the generated carries at various stages. The numbers on the signals indicate the input cycle for which that particular carry was generated. The question mark shows that the carry generated may not be correct, i.e., may be too pessimistic.

In the first cycle, the latched look-ahead was generated during input number 1. During this cycle, the top block generates a carry (2 at B), and later the look-ahead carry (2? at C) is generated. The quality of the look-ahead is unsure at this point, hence the "?." Meanwhile, D has the latched carry from input number 1, and generates the carry for the bottom half of the data at E.

In the second cycle, A has the latched uncertain look-ahead carry. The carries generated at both B and C will be uncertain (shown as 3?), because they both depend on A. D and E, however, show good carries, because they have been derived from the full chain, albeit one cycle delayed.

At the end of the second cycle (indicated at 1000') the latched look-ahead carry at A is compared with the true carry from E. As in this example, it is assumed they are the same, the latched look-ahead carry (2 on A) was good, and so the carry derived from it (3 on B) was also good. Note that the look-ahead generated in this cycle (3? on C) cannot be trusted yet (the carry value might possibly be improved), and so its latched version A on the next cycle still shows a "?."

The third cycle is similar, except it is assumed that the comparison between A and E at the cycle's end (indicated at 1000") fails. The latched look-ahead carry (3?) was too pessimistic. So the results derived from that (the two 4?'s) are discarded and (A) is latched from E rather than C. The cycle is repeated, now with a known good carry, and new carries are generated.

It can be seen that the extra cycle added on the rare occasions when the look-ahead carry is too pessimistic (such as the case in FIG. 9) will restore full efficiency. It should be remembered that the compression operation without this check will still be correct (will decompress correctly), but may not show as large a compression ratio. Accordingly, the use of the above technique should be selectable, depending on whether speed or high compression ratio is desired.

As has been described, the present invention provides an apparatus for performing data compression. It will be also be appreciated that the arrangement and method described above will typically be carried out in hardware. It is understood that the present invention provides an improvement to the earlier LZ1 multi-byte compression engine, that dramatically reduces the number of gates required for a given number of bytes per cycle. Pipelining can be employed to compensate for the extra delays, which necessitates a look-ahead carry generator. Deficiencies in the look-ahead carry can be corrected with a small loss in performance.

For ease of explanation, the description presented above uses specific values for the size of a branch history table, the number of entries, etc.; however, it is understood by those skilled in the art that other values are possible.

While the invention has been particularly shown and described with reference to a preferred embodiment, it will be understood by those skilled in the art that various changes in form and detail may be made therein without departing from the spirit and scope of the invention.

What is claimed is:

1. A compression arrangement for performing data compression of a data string, said compression arrangement comprising:
    an input buffer for holding a first sequence of bytes of said data string;
    a history buffer for holding a second sequence of bytes of said data string;
    a comparison matrix coupled to said input buffer and said history buffer, wherein each column of said comparison matrix is formed by a plurality of "triangle" logic gate stages connected in series, wherein each of said plurality of "triangle" logic gate stages is arranged to produce a carry value for passing to another one of said plurality of "triangle" logic gate stages, wherein the product of the number stages in said plurality of "triangle" logic gate stages and the number logic gates in each of said plurality of "triangle" logic gate stages is less than the number of logic gates required for an equivalent circuit having a single logic circuit stage;
    an input latch coupled to an input of said comparison matrix for receiving a carry value from another carry-value-producing circuit;
    means for producing a look-ahead carry value coupled to a predetermined number of said plurality of "triangle" logic gate stages for producing a look-ahead carry value;
    a MAX function/priority encoder for detecting a row of said comparison units and preceding comparison units in the same column in which a largest number of consecutive byte matches occurred; and
    a token encoder for encoding as a token a sequence of matched bytes detected by said MAX function/priority encoder.

2. The compression arrangement of claim 1, wherein the area of each of said plurality of "triangle" logic gate stages is proportional to the number of gates within.

3. The compression arrangement of claim 1, wherein each of said plurality of "triangle" logic gate stages has an output at the bottom of said"triangle" to output the longest surviving strings.

4. The comparison arrangement of claim 1, wherein said comparison arrangement further includes an intermediate latch for receiving a carry value from one of said "triangle" logic gate stages that is coupled to said means for producing a look-ahead carry value.

5. The comparison arrangement of claim 4, wherein said means for producing a look-ahead carry value includes logic means coupled to outputs of comparators via logic gates and arranged to be coupled to comparison units in other columns of said comparison matrix.

6. The comparison arrangement of claim 5, wherein said comparison arrangement further includes means for comparing a carry value produced at an output of said comparison matrix to an earlier-generated carry look-ahead value to determine whether or not said carry value can be improved.

7. The comparison arrangement of claim 1, wherein said comparison matrix further includes a plurality of comparison units for comparing bytes held in said input buffer with bytes held in said history buffer, wherein bytes of said history buffer being coupled to diagonally displaced comparison units in said comparison matrix.

8. The compression arrangement of claim 1, wherein each of said plurality of "triangle" logic gate stages has a smaller number logic gates located at the top of said"triangle."

* * * * *